(12) United States Patent
Ando et al.

(10) Patent No.: US 7,417,712 B2
(45) Date of Patent: Aug. 26, 2008

(54) EXPOSURE APPARATUS HAVING INTERFEROMETER AND DEVICE MANUFACTURING METHOD

(75) Inventors: Miwaki Ando, Utsunomiya (JP); Yoshinori Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 504 days.

(21) Appl. No.: 11/246,036

(22) Filed: Oct. 6, 2005

(65) Prior Publication Data

US 2006/0119821 A1 Jun. 8, 2006

(30) Foreign Application Priority Data

Oct. 8, 2004 (JP) ............................. 2004-296973

(51) Int. Cl.
*G03B 27/54* (2006.01)
*G03B 27/52* (2006.01)

(52) U.S. Cl. .......................................... 355/67; 355/55
(58) Field of Classification Search .................. 355/52, 355/53, 55, 67–71; 356/399–401, 511, 515; 250/548

See application file for complete search history.

(56) References Cited

U.S. PATENT DOCUMENTS

| | | | | |
|---|---|---|---|---|
| 5,757,505 A | * | 5/1998 | Mizutani | 356/400 |
| 6,312,373 B1 | | 11/2001 | Ichihara | 515/359 |
| 6,650,399 B2 | * | 11/2003 | Baselmans et al. | 355/55 |
| 7,095,509 B2 | * | 8/2006 | Kakuchi | 356/515 |
| 7,230,682 B2 | * | 6/2007 | Shimizu et al. | 355/77 |
| 2003/0128346 A1 | | 7/2003 | Murakami et al. | 355/53 |

FOREIGN PATENT DOCUMENTS

| | | |
|---|---|---|
| JP | 57-064139 | 4/1982 |
| JP | 2000-097666 | 4/2000 |
| JP | 2000-146705 | 5/2000 |
| JP | 2000-277411 | 10/2000 |
| JP | 2000-277412 | 10/2000 |

* cited by examiner

Primary Examiner—Hung Henry Nguyen
(74) Attorney, Agent, or Firm—Morgan & Finnegan LLP

(57) ABSTRACT

Provided is an exposure apparatus including a projection optical system for projecting an exposure pattern onto an object to be exposed, a measurement device for measuring an optical performance of the projection optical system by guiding light to the projection optical system through a measurement pattern to detect interference fringes formed by the light emitted from the projection optical system, and an adjustment portion for adjusting a numerical aperture of the light that illuminates the measurement pattern, in which the adjustment portion adjusts the numerical aperture so that the visibility of the interference fringes V, which is defined as $V=(I_{max}-I_{min})/(I_{max}+I_{min})$, is equal to or more than 0.3, where $I_{max}$ represents the maximum amount of light of the interference fringes, and $I_{min}$ represents the minimum amount of light of the interference fringes, when the measurement device measures an optical performance of the projection optical system.

19 Claims, 14 Drawing Sheets

FIG. 5A
FIG. 5B
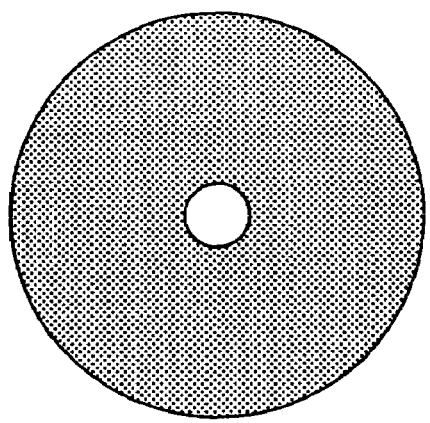
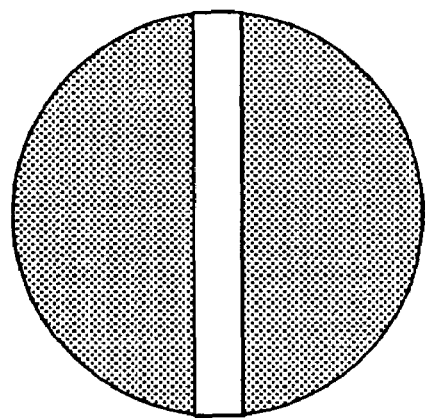
FIG. 6
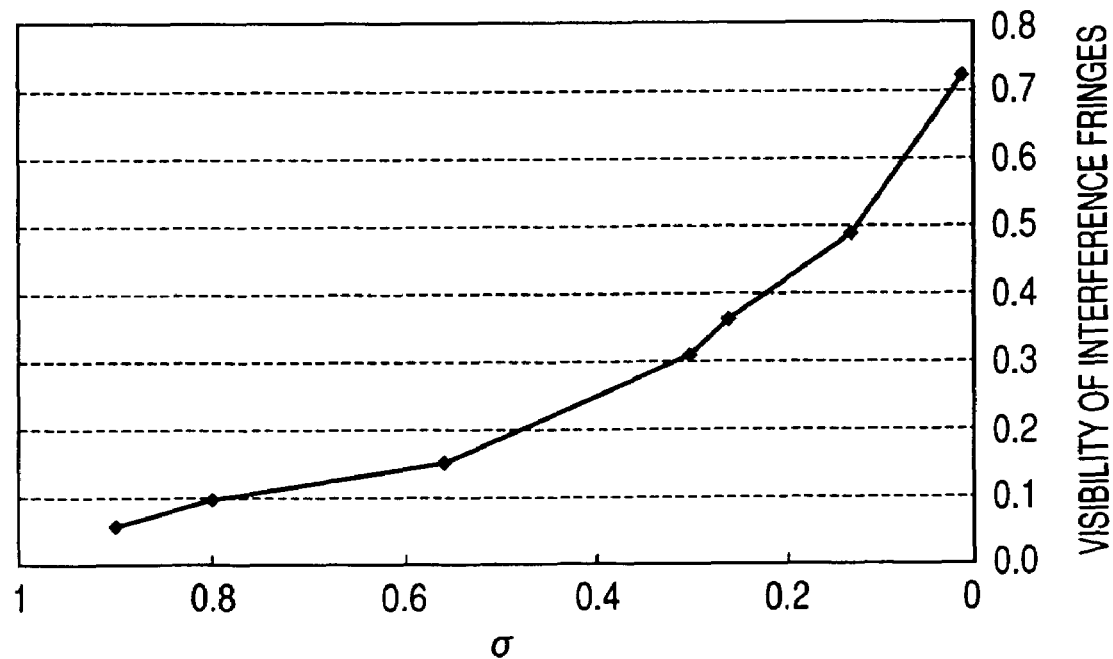

EXPOSURE APPARATUS HAVING INTERFEROMETER AND DEVICE MANUFACTURING METHOD

BACKGROUND OF THE INVENTION

1. Field of the Invention

The present invention relates to an exposure apparatus, and more particularly to an exposure apparatus equipped with an interferometer for measuring a wavefront aberration of a projection optical system for projecting a pattern formed on a mask onto an object to be exposed, and an exposure method therefor.

2. Description of the Related Art

Conventionally, in manufacturing a semiconductor device such as an IC or an LSI, an image pickup device such as a CCD, a display device such as a liquid crystal panel, or a device such as a magnetic head in a photolithography process, there has been used a projection exposure apparatus that transfers a pattern formed on a mask (reticle) onto an object to be exposed. The projection exposure apparatus is required to precisely transfer the pattern formed on the reticle onto the object to be exposed with a given magnification. For that reason, it is important to use the projection optical system that offers high imaging performance and suppresses aberration. Particularly, in recent years, due to a growing demand for further miniaturized semiconductors, even the small aberration of the optical system greatly affects the transfer pattern. For that reason, there is a demand for measuring the optical performance (for example, wavefront aberration, Zernike coefficient) of the projection optical system with high precision in a state where the projection optical system is mounted on the exposure apparatus main body. Also, it is important to simplify and speed up the measurement and to reduce the costs from the viewpoints of enhancing the productivity and cost efficiency.

As a method of measuring the optical performance of the projection optical system, there is a method in which a mask pattern is actually etched into a wafer, and a resultant resist image is observed by a scanning electron microscope (SEM) or the like for inspection. However, this method has a problem in that the inspection takes time by performing exposure, development, and the like, and the reproducibility of the inspection suffers because of the difficulty of the operation of the SEM and an error caused in a process of resist coating or developing. In order to solve the above problem, there has been proposed that the optical performance of the projection optical system is measured by using a point diffraction interferometer (PDI) having a pin hole for forming an ideal spherical wave. Moreover, it has been proposed to measure the optical performance of the projection optical system by using a shearing interferometer (or Talbot interferometer). In recent years, it has been also proposed to measure the optical performance of the projection optical system by using a line diffraction interferometer (LDI) having a slit for forming an ideal cylindrical wave or an ideal elliptical wave (for example, refer to Japanese Patent Application Laid-Open No. S57-064139, Japanese Patent Application Laid-Open No. 2000-146705, and Japanese Patent Application Laid-Open No. 2000-097666). In addition, the applicants of the present invention have proposed an exposure apparatus equipped with an interferometer in Japanese Patent Application Laid-Open No. 2000-277411 and Japanese Patent Application Laid-Open No. 2000-277412.

It should be noted that, when exposure light has high coherency, light beams of the exposure light that have passed through the pattern on the mask interfere with one another. As a result, the pattern cannot be accurately transferred onto a wafer. For that reason, the exposure apparatus usually makes the exposure light incoherent in an illumination optical system. However, when the exposure apparatus is equipped with an interferometer, the interferometer must utilize an exposure light having low coherency, which leads to a deterioration of the visibility of interference fringes. As a result, there arises a problem in that a precision in the measurement of the wavefront aberration is degraded. In this specification, the visibility V is defined by the following formula, $$V=(I\max-I\min)/(I\max+I\min),$$

where Imax represents the maximum amount of light of the interference fringes, and Imin represents the minimum amount of light of the interference fringes.

SUMMARY OF THE INVENTION

Accordingly, the present invention is directed to an exposure apparatus equipped with an interferometer and an exposure method, with which it is possible to obtain the aberration information of a projection optical system with a high precision.

According to one aspect of the present invention, an exposure apparatus includes: a projection optical system for projecting an exposure pattern onto an object to be exposed; a measurement device for measuring an optical performance of the projection optical system by guiding light to the projection optical system through a measurement pattern to detect interference fringes formed by the light emitted from the projection optical system; and adjustment device for adjusting a numerical aperture of the light for illuminating the measurement pattern, in which the adjustment device adjusts the numerical aperture to obtain V, $$V=(I_{max}-I_{min})/(I_{max}+I_{min}),$$

being equal to or more than 0.3, where V represents the visibility of the interference fringes, $I_{max}$ represents the maximum amount of light of the interference fringes, $I_{min}$ represents the minimum amount of light of the interference fringes when the measurement device measures an optical performance of the projection optical system.

According to another aspect of the present invention, an exposure apparatus includes: a projection optical system for projecting an exposure pattern onto an object to be exposed; a measurement device for measuring an optical performance of the projection optical system by guiding light to the projection optical system through a measurement pattern to detect interference fringes formed by the light emitted from the projection optical system; and adjustment device for adjusting a numerical aperture of the light that illuminates the measurement pattern, in which the adjustment device adjusts the numerical aperture to satisfy $\sigma \leq 0.3$ when the numerical aperture is $NA_{i1}$, the numerical aperture of the projection optical system on the measurement pattern side is $NA_o$, and $\sigma$ is $NA_{i1}/NA_o$, when the measurement device measures an optical performance of the projection optical system.

According to another aspect of the present invention, an exposure apparatus includes: a projection optical system for projecting an exposure pattern onto an object to be exposed; a measurement device for measuring an optical performance of the projection optical system by guiding light to the projection optical system through a measurement pattern to detect interference fringes formed by the light emitted from the projection optical system; and adjustment device for adjusting a numerical aperture of the light that illuminates the measurement pattern, in which the adjustment device adjusts the numerical aperture so that the numerical aperture of the light on the measurement pattern in a lateral direction is different from the numerical aperture of the light on the measurement pattern in a longitudinal direction, when the measurement device measures an optical performance of the projection optical system.

According to another aspect of the present invention, an exposure apparatus includes: a projection optical system for projecting an exposure pattern onto an object to be exposed; a measurement device for measuring an optical performance of the projection optical system as interference fringes by guiding light to the projection optical system through a measurement pattern; and device for converting the light that illuminates the exposure pattern into incoherent light and disposed so as to be retreatable from an optical path.

According to another aspect of the present invention, a device manufacturing method includes the steps of: exposing an object to be exposed by using the exposure apparatus described above; and developing the exposed object.

Additional objects and other features of the present invention will become apparent from preferred embodiments described below with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 5A and 5B are plan views schematically showing a σ stop of the illumination apparatus shown in FIG. 2;

FIG. 6 is a graph showing a relationship between a and interference fringes;

DETAILED DESCRIPTION OF THE PREFERRED EMBODIMENTS

Embodiments of the present invention will now be described in detail in accordance with the accompanying drawings.

First Embodiment

Figure 1:
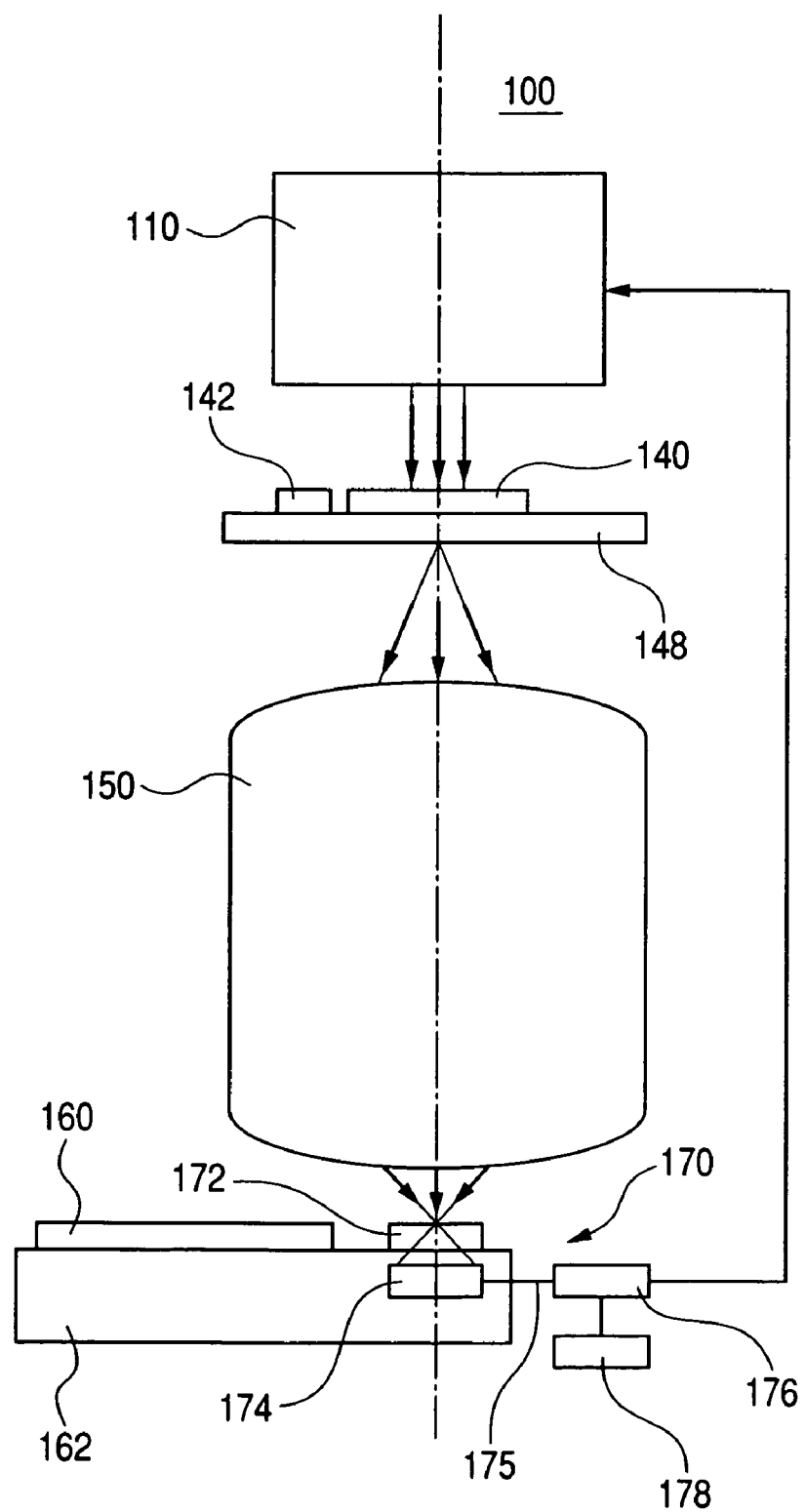
FIG. 1 is a block diagram schematically showing an exposure apparatus according to a first embodiment of the present invention.

Hereinafter, an exposure apparatus 100 according to a first embodiment of the present invention will be described with reference to the accompanying drawings. Here, FIG. 1 shows a schematic diagram of the block diagram of the exposure apparatus 100. The exposure apparatus 100 is, for example, a projection exposure apparatus that exposes a circuit pattern formed on a mask 140 onto an object to be exposed (plate) 160 through a step and scan system or a step and repeat system. In this embodiment, the exposure apparatus (also called "scanner") of the step and scan system will be exemplified. Herein, the "step and scan system" is directed to an exposure method by which a mask and a wafer are sequentially scanned with an exposure light to expose a mask pattern onto the wafer, and after exposure of one shot, the wafer is stepped to move to a subsequent exposure area. The "step and repeat system" is directed to an exposure method by which the wafer is stepped to move to an exposure area of a subsequent shot every time all the wafers are collectively subjected to exposure.

The exposure apparatus 100 includes an illumination apparatus 110, a mask 140, a projection optical system 150, a plate 160, and a measurement device (interferometer) 170. In this specification, a reference numeral with no alphabet typifies reference symbols obtained by adding capital alphabets to the reference numeral.

Figure 2:
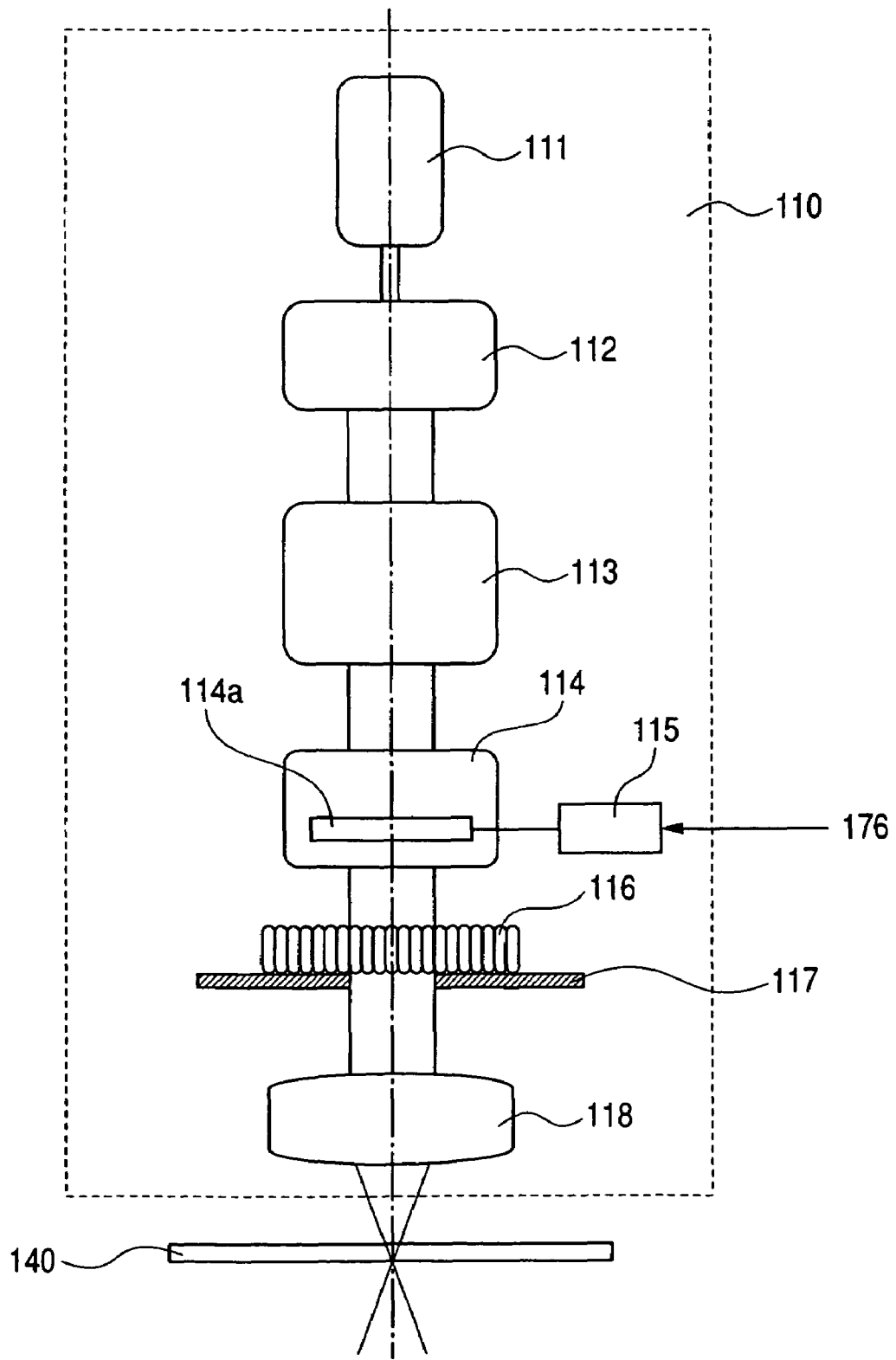
FIG. 2 a block diagram schematically showing an illumination apparatus of the exposure apparatus shown in FIG. 1.

The illumination apparatus 110 illuminates the mask 140 on which an exposure circuit pattern is formed. As shown in FIG. 2, the illumination apparatus includes a light source portion 111 and an illumination optical system. Here, FIG. 2 is a schematic block diagram of the illumination apparatus 110. The light source portion 111 can be formed of a laser such as an ArF excimer laser having a wavelength of about 193 nm or a KrF excimer laser having a wavelength of about 248 nm. However, the type of the laser is not limited to the excimer laser, and the number of lasers is not also limited. A light source applicable to the light source section 111 is not limited to a laser, and may use one or more lamps such as a mercury lamp and a xenon lamp.

The illumination optical system is an optical system that illuminates the mask 140. The illumination optical system includes a light beam shaping portion 112, an incoherent light forming portion 113, an illumination state adjusting portion 114, an optical integrator 116, a stop 117, and a lens system 118. In this embodiment, the illumination optical system also illuminates the measurement pattern of a measurement device 170 that will be described below.

The light beam shaping portion 112 shapes a parallel light beam from the laser light source into a desired beam configuration. The incoherent light forming portion 113 makes a coherent laser light beam incoherent. The illumination state adjusting portion 114 includes a zoom lens for adjusting a beam diameter according to NA of the illumination optical system, an σ stop 114a, and a driver portion 115 for driving the open/close of the σ stop 114a. The σ stop 114a functions as NA adjusting means for changing a numerical aperture (NA) of the light that illuminates the measurement pattern. A control unit 176 controls drive of the driver portion 115 as will be described later. In this specification, σ is defined by $N_{i1}/NA_o$ when the numerical aperture of the illumination optical system is $NA_{i1}$, and the numerical aperture of the projection optical system 150 on a mask side is $NA_o$. As a result, the illumination optical system illuminates a surface of a reticle 140 with a desired value of σ stop.

The optical integrator 116 has functions of making the illumination light uniform and incoherent. The optical integrator 116 is composed of, for example, a fly's eye lens in which plural lenses are two-dimensionally arranged, and an optical rod. The optical integrator 116 may be detachably provided on an optical path by a turret. That is, the optical integrator 116 is disposed on the optical path at the time of exposure, and the optical integrator 116 is disposed outside the optical path at the time of measurement. This makes it possible to improve the coherency of the illumination light at the time of measurement, to thereby increase the visibility V of the interference fringes.

The (aperture) stop 117 is disposed in the vicinity of the optical integrator 116, and defines an effective light source configuration. The aperture stop 117 also functions as an NA adjusting means for improving the visibility of the interference fringes. For that reason, plural kinds of stops 117 different in the aperture diameter may be disposed in the illumination apparatus 110 such that the stops 117 can be switched by the turret. The lens system 118 includes a masking blade and a condenser lens, and images a light beam, which has passed through the stop 117, on a surface of the mask 140.

The mask (or reticle) 140 is made of, for example, quarts. A circuit pattern (or an image) to be transferred is formed on the mask 140, and the mask 140 is supported and driven by a mask stage (or a reticle stage) 148. Diffraction light emitted from the mask 140 passes through the projection optical system 150, and then projected on the plate 160. The mask 140 and the plate 160 are optically conjugated to each other. Being a scanner, the exposure apparatus 100 scans the mask 140 and the plate 160 at a speed rate of a reduction magnification ratio to transfer the pattern of the mask 140 onto the plate 160. In the case of the exposure apparatus of the step and repeat system (also called "stepper"), exposure is conducted in a state where the mask 140 and the plate 160 are made stationary.

The projection optical system 150 can be formed of, for example, an optical system consisting of only plural lens elements, an optical system (catadioptric system) having plural lens systems and at least one concave mirror, an optical system having a plural of lens elements and at least one diffractive optical element such as a kinoform, or an optical system consisting of only plural mirror elements. The optical performance (for example, wavefront aberration, Zernike coefficient) of the projection optical system 150 is measured by the measurement device 170.

The plate 160 is a member to be treated such as the wafer or a liquid crystal substrate, and coated with a photo resist. The plate 160 is mounted on a stage 162 through a chuck (not shown). The stage 162 supports the plate 160 and a part of the measurement device 170. Since the stage 162 can be applied with any structure known in the art, the detailed structure and operation thereof will be omitted. For example, the stage 162 can move the plate 160 and a part of the measurement device 170 in directions of X and Y by using a linear motor. The mask 140 and the plate 160 are, for example, scanned in synchronization, and the stage 162 and the mask stage 148 are driven at a constant speed ratio.

The measurement device 170 has a function of measuring the optical performance (for example, wavefront aberration) of the projection optical system 150 as the interference fringes. The measurement device 170 has an NA adjusting means that changes the NA of the illumination light in order to enhance the visibility of the interference fringes, and the NA adjusting means is controlled. In addition, the measurement device 170 includes first and second measurement patterns, a stage reference plate (or mask) 172 which is provided on the stage 162, an image pickup means 174, a communication capable 175, a control unit 176, and a memory 178. In this embodiment, the NA adjusting means is formed of a σ stop 114a.

The measurement device 170 guides the light to the projection optical system 150 through the first measurement pattern to receive the light that has passed through the projection optical system 150 through the second measurement pattern, to thereby measure the optical performance of the projection optical system 150 as the interference fringes. The measurement device 170 is a PDI having a pin hole for forming an ideal spherical wave. Alternatively, the measurement device 170 may be formed of an LDI having a slit for forming an ideal spherical wave in a shorter direction of the slit, or may be formed of a shearing interferometer that uses the shearing interference.

Figure 3:
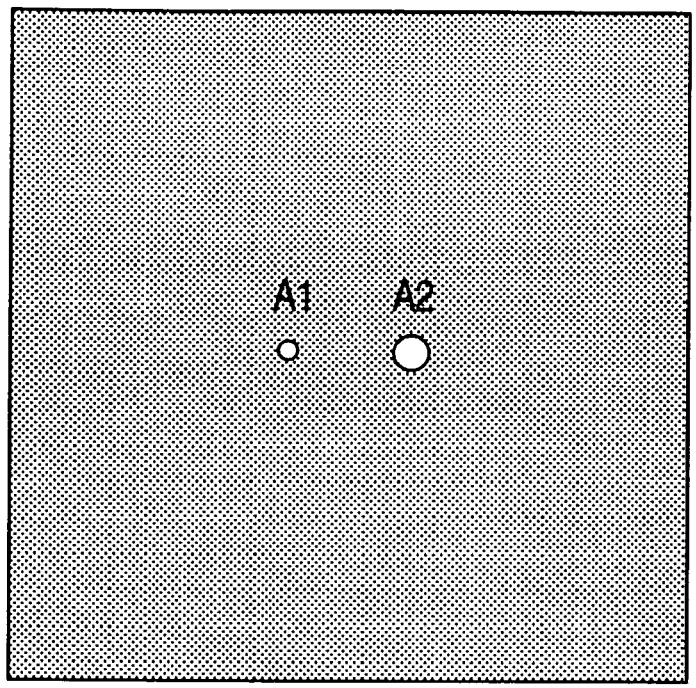
FIG. 3 is a plan view schematically showing a measurement pattern used in a measurement device of the exposure apparatus shown in FIG. 1.

The first measurement pattern may be formed on the mask 140, may be formed on a mask 142 mounted on the mask stage 148 which is different from the mask 140, or may be formed on the mask stage 148. The illumination apparatus 110 illuminates not only the mask 140 but also the measurement pattern. An example of the first measurement pattern is shown in FIG. 3. In FIG. 3, a first measurement patterns A1 and A2 are formed on the mask 142 in which a gray portion is a light shielding portion, and a white portion is a light transmitting portion. The patterns A1 and A2 are formed of pin holes that are different in size. When the NA of the light that illuminates the patterns A1 and A2 is $NA_{i1}$, a pin hole diameter ΦA1 of the pattern A1 and a pin hole diameter ΦA2 of the pattern A2 are represented by the following formulas, respectively.

$$\Phi A1 \leq 1.22 \cdot \lambda/(2 \cdot NA_{i1}) \tag{2}$$

$$\Phi A2 = 1.22 \cdot \lambda/NA_{i1} \tag{3}$$

The size of ΦA1 is equal to or less than a diffraction limit. The light that has passed through the pin hole A1 forms an ideal spherical wave having no aberration information before the measurement pattern.

Figure 4:
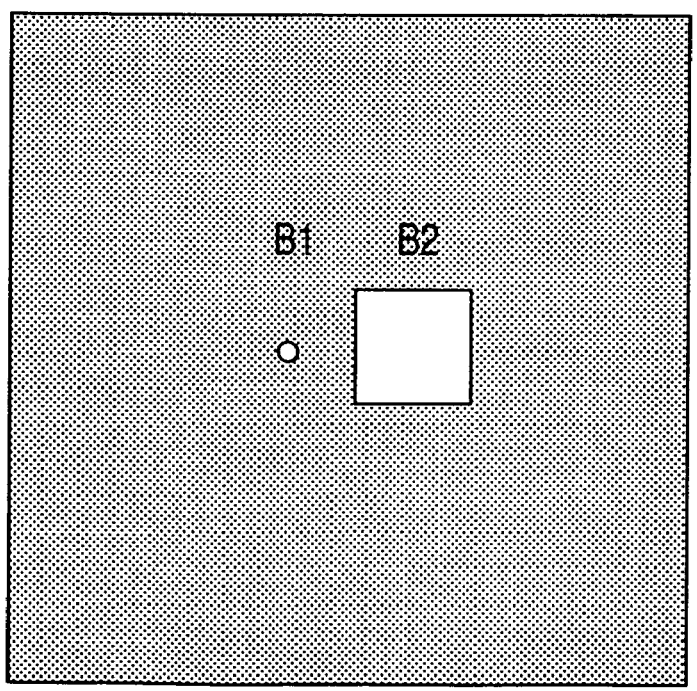
FIG. 4 is a plan view schematically showing another measurement pattern used in the measurement device of the exposure apparatus shown in FIG. 1.

The second measurement pattern is formed on the stage reference plate 172 which is provided on the stage 162. An example of the second measurement pattern is shown in FIG. 4. In the figure, second measurement patterns B1 and B2 are light transmitting portions, and a gray portion is a light shielding portion.

Supposing the pattern B1 is a pin hole, A pin hole diameter ΦB1 of the pinhole B1 is defined by the following formula, $$\Phi B1 \leq 1.22 \cdot \lambda/(2 \cdot NA_i) \quad (4)$$

where $NA_i$ represents the NA of the light of the projection optical system 150 on the image side. The pin hole diameter ΦB1 has a size which is equal to or less than the diffraction limit.

On the other hand, the pattern B2 is formed of a square aperture, and its side ΔB2 is determined by a spatial frequency to be measured of the projection optical system 150. The side ΔB2 is set to be wider in the case where the spatial frequency is desired to be measured up to a higher frequency, and set to be narrower when the spatial frequency to be measured is a low frequency. ΔB2 is defined by the following formula, $$\Phi B2 = 2 \cdot f \cdot \lambda / NA_i \quad (5)$$

where f represents the spatial frequency of a pupil of the projection optical system 150. In this case, the frequency f of the wavefront aberration in which the radius of the pupil is one cycle is set to 1.

The images of the patterns A1 and A2 are imaged on the patterns B2 and B1 by the projection optical system 150, respectively. The light that has passed through the pattern A1 passes through the projection optical system 150 with an ideal spherical wave having no aberration information before the measurement pattern. Then, the light enters the pattern B2, and passes through the pattern B2 while keeping the wavefront aberration information of the projection optical system 150.

On the other hand, the light that has passed through the pattern A2 passes through the pattern B1 to form an ideal spherical wave. The interference fringes attributable to two light beams that have passed through the patterns B1 and B2 are detected by an image pickup means 174. Then, the wavefront aberration of the projection optical system 150 is calculated according to the image data of the interference fringes. As will be described later with reference to FIG. 6, in order to enhance a precision in the aberration measurement, a σ stop 114a of the illumination state adjusting portion 114 shown in FIG. 2 is adjusted to reduce σ (NA of the illumination light) of the illumination light.

FIG. 5A shows the configuration of the σ stop 114a. In order to calculate the wavefront aberration of the projection optical system 150 by using the image data of the interference fringes, it is desirable that the visibility V of the interference fringes be close to 1 as much as possible. When the visibility is impaired, a miscalculation occurs in the measurement value of the wavefront aberration due to an influence of noises. When the visibility V is about 0.6, an error of ±2 occurs in the wavefront aberration. When the visibility V is about 0.3, an error of ±6 mλ occurs in the wavefront aberration. On the other hand, the wavefront aberration of the projection optical system 150 is normally required to be kept to less than several mλ to several tens mλ. In order to evaluate the wavefront aberration, it is necessary to measure the wavefront aberration with a precision of at least 10 mλ or less. Desirably, it is necessary to calculate the wavefront aberration with several mλ. FIG. 6 shows a relationship between the visibility and the illumination σ (NA of the illumination light). Changing the illumination light σ leads to an increase in a spatial coherency. The smaller σ becomes, the higher the visibility V of the interference fringes becomes. As is understood from FIG. 6, it is desirable that the lights for illuminating the patterns A1 and A2 are ideally the coherent illumination (σ=0), and it is necessary to illuminate the patterns A1 and A2 with at least σ≦0.3. This is because the visibility V is required to be at least 0.3 or more.

In this embodiment, the σ stop 114a of the illumination state adjusting portion 114 is changed from the σ stop 114a at the time of exposure to reduce the value σ, to thereby improve the spatial coherency. As a result, it becomes possible to obtain the interference fringes having the higher visibility, with which the wavefront aberration of the projection optical system 150 can be calculated with high precision.

Figure 7A:
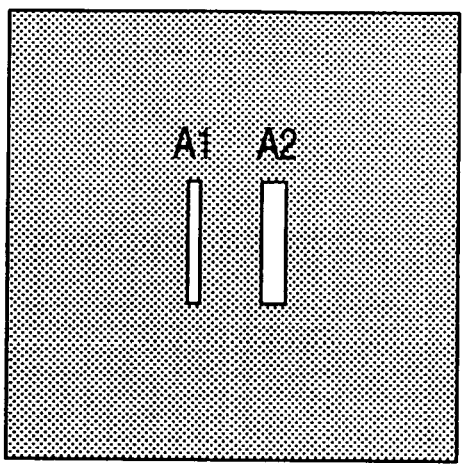
FIGS. 7A and 7B are plan views schematically showing modified examples of the measurement patterns shown in FIGS. 3 and 4.
Figure 7B:
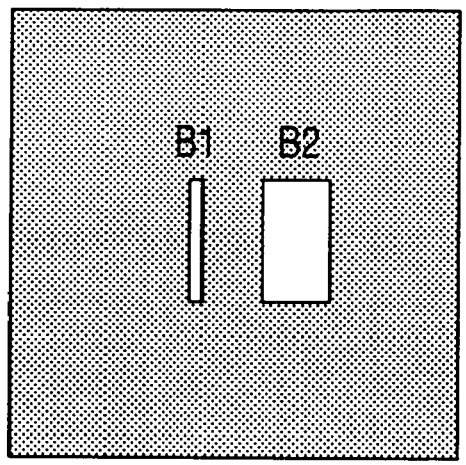

In this embodiment, the patterns A1, A2, B1, and B2 are formed of the pin holes and the rectangular apertures. However, those patterns may have slits and rectangular apertures as shown in FIGS. 7A and 7B. In this case, short sides of the slits A1, A2, and B1 have lengths ΔA1, ΔA2, and ΔB1, respectively, which are represented by the following formulas. In this example, ΔA1 and ΔB1 are widths of the diffraction limit or less, and each become the wave front having the same component as that of the ideal spherical wave in a lateral direction of the slit along its short sides.

$$\Delta A1 \leq 1.22 \cdot \lambda/(2 \cdot NA_{i1}) \quad (6)$$

$$\Delta A2 = 1.22 \cdot \lambda/NA_{i1} \quad (7)$$

$$\Delta B1 \leq 1.22 \cdot \lambda/(2 \cdot NA_i) \quad (8)$$

On the other hand, the width ΔB2 of the rectangular aperture is determined by the spatial frequency f to be measured of the projection optical system 150, as in the case of measuring the width of the pin hole aperture, and represented by the following formula.

$$\Delta B2 = 2 \cdot f \cdot \lambda / NA_i \quad (9)$$

The lengths L in the longitudinal direction of the slit and the rectangular aperture are longer the better from the viewpoint of the amount of light.

However, it is necessary to make those lengths smaller than a so-called isoplanatic region where the aberration of the projection optical system 150 is substantially the same.

The image pickup means 174 is formed of a CCD and the like, and detects the interference fringes of two light beams that have passed through the slit A1 or B1 and the window A2 or B2. A cable 175 connects the image pickup means 174 and the control unit 176 such that those elements can communicate with each other. The control unit 176 acquires phase information based on an output of the image pickup means 174. Also, the control unit 176 controls the respective portions of the exposure apparatus 100. In particular, the control unit 176 controls the driver portion 115 to determine the aperture of the a stop 114a. The memory 178 stores therein a measurement method that will be described later, a processing method with which the control unit 176 acquires the phase information based on an output of the image pickup means 174, the phase information acquired by the control unit 176, a control method conducted by the control unit 176, and other data.

Figure 8:
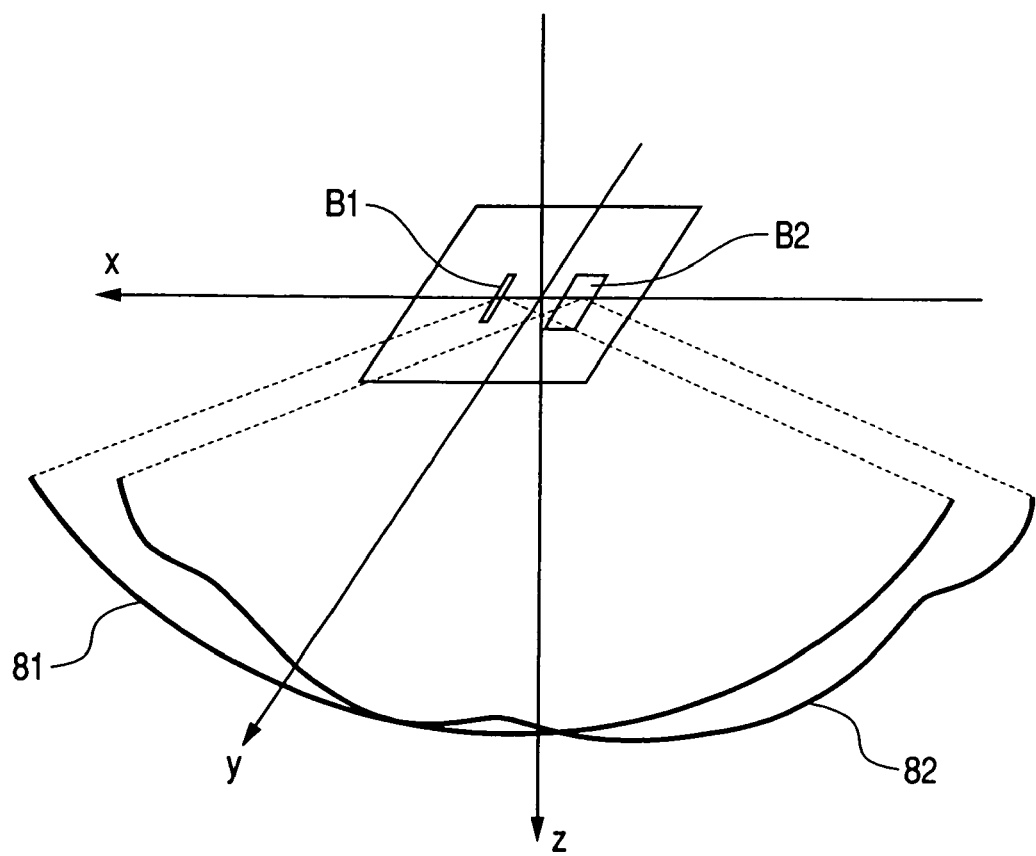
FIG. 8 is a schematic diagram showing lights emitted from the centers of the measurement patterns shown in FIGS. 7A and 7B.

FIG. 8 is a schematic diagram showing the lights that passed through the patterns B1 and B2. The light that has passed through the split B1 has an ideal wave front 81 in a lateral direction of the slit because the slit width is the diffraction limit or less. Because the light that has passed through the window B2 is the ideal spherical wave when the light has passed through the pattern A1 on the reticle side, the light forms a light 82 to be detected having only the aberration information of the projection optical system 150. The wavefront aberration in the lateral direction of the slit in the projection optical system 150 is calculated from those two light beams 81 and 82.

The image pickup means 174 picks up the light that has passed through the slit B1 and the window B2 to detect the interference fringes occurring in a region where two lights are overlapped. Since the x-direction of the light beam 81 is equal in phase, the wavefront aberration in the x-direction of projection optical system 150 can be obtained by extracting the phase information from the interference fringes.

The plural interference fringes that have been imaged are transmitted to the control unit 176 through the cable 175 from the image pickup means 174, and the control unit 176 acquires the phase information. The control unit 176 may use, for example, an electronic Moiré method. In this embodiment, since the interference fringes has carrier fringes, it is possible to obtain the phase information through a process in which the imaged interference fringes are multiplied by the carrier fringes, which have been created by the control unit 176 or prepared and stored in the memory 178 in advance. The phase information can be extracted by a sheet of interference fringes with the use of the electronic Moiré method, which is advantageous in view of saving time. Also, the phase information may be acquired by using fringe scan.

Even in the case where the measurement pattern is a slit, the σ stop 114a is adjusted to reduce σ of the illumination light so as to enhance a precision in the aberration measurement, as in the case of the pin hole. However, when the σ value is reduced, the light that has passed through the pattern cannot enter the overall area of the pupil of the projection optical system 150. As a result, there arises such a problem in that the aberration information on the overall area of the pupil in the projection optical system 150 cannot be obtained.

Figure 17A:
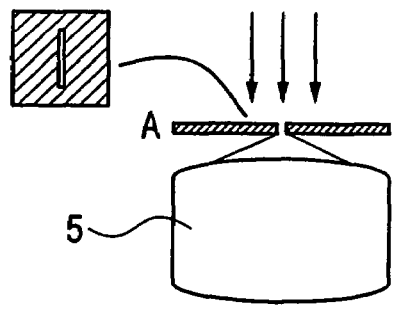
FIGS. 17A and 17B are diagrams for explaining a problem occurring when a slit is used for the measurement pattern.
Figure 17B:
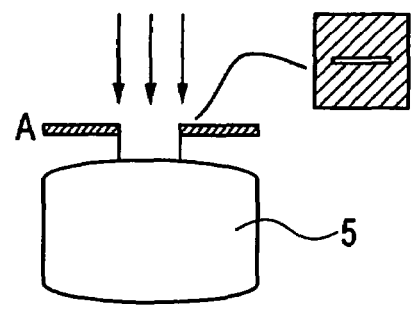

The above problem will be described with reference to FIGS. 17A and 17B. FIG. 17A shows a state in which the light that has passed through the slit is spread toward the lateral direction of the slit, and FIG. 17B shows a state in which the light that has passed through the slit is spread toward the longitudinal direction of the slit. Because the width of the slit in the lateral direction thereof is the diffraction limit or less, the light is spread with the ideal spherical wave. However, because the width of the slit is wide in the longitudinal direction of the slit, the light is spread by only an incident angle of the incident light, and the light cannot enter the overall area of the pupil in the projection optical system 150 in the longitudinal direction of the pattern when the incident σ value is small.

Under the above circumstances, this embodiment uses a rectangular σ stop 114a as shown in FIG. 5B. In this case, the σ value in the lateral direction of the rectangle is σ≦0.3 in order to improve the visibility of the interference fringes. In order to allow the light to enter the overall area of the pupil or the area of the pupil as broad as possible in the projection optical system 150, σ in the longitudinal direction of the rectangle is set to be equal to or larger than 1 or as large as possible in the illumination optical system. With this setting, the wavefront aberration of the pupil over the area as broad as possible in the projection optical system 150 can be calculated with a high precision.

Only the wavefront aberration in the lateral direction of the slit in the projection optical system 150 can be calculated based on the light that has passed through the patterns B1 and B2. Accordingly, in order to obtain the wavefront aberrations of the overall projection optical system 150, the wavefront aberrations in the x-direction and in the y-direction of the projection optical system 150 must be measured respectively. The wavefront aberration information in the x- and y-directions of the projection optical system 150 are combined together, thereby making it possible to obtain the wavefront aberration information of the entire projection optical system 150. In addition, the wavefront aberrations are measured while an angle of field is changed, thereby making it possible to obtain the wavefront aberration information in all the angles of field of the projection optical system 150. The control portion 176 takes out rotationally asymmetry components from the wavefront aberration in the respective angle of field, thereby making it possible to also obtain the distortion components of the projection optical system 150. Further, the control unit 176 can obtain the field curvature of the projection optical system 150 from the rotationally symmetry components of the wavefront aberration. It is needless to say that only the wavefront aberration of one angle of field may be measured.

Second Embodiment

Figure 9:
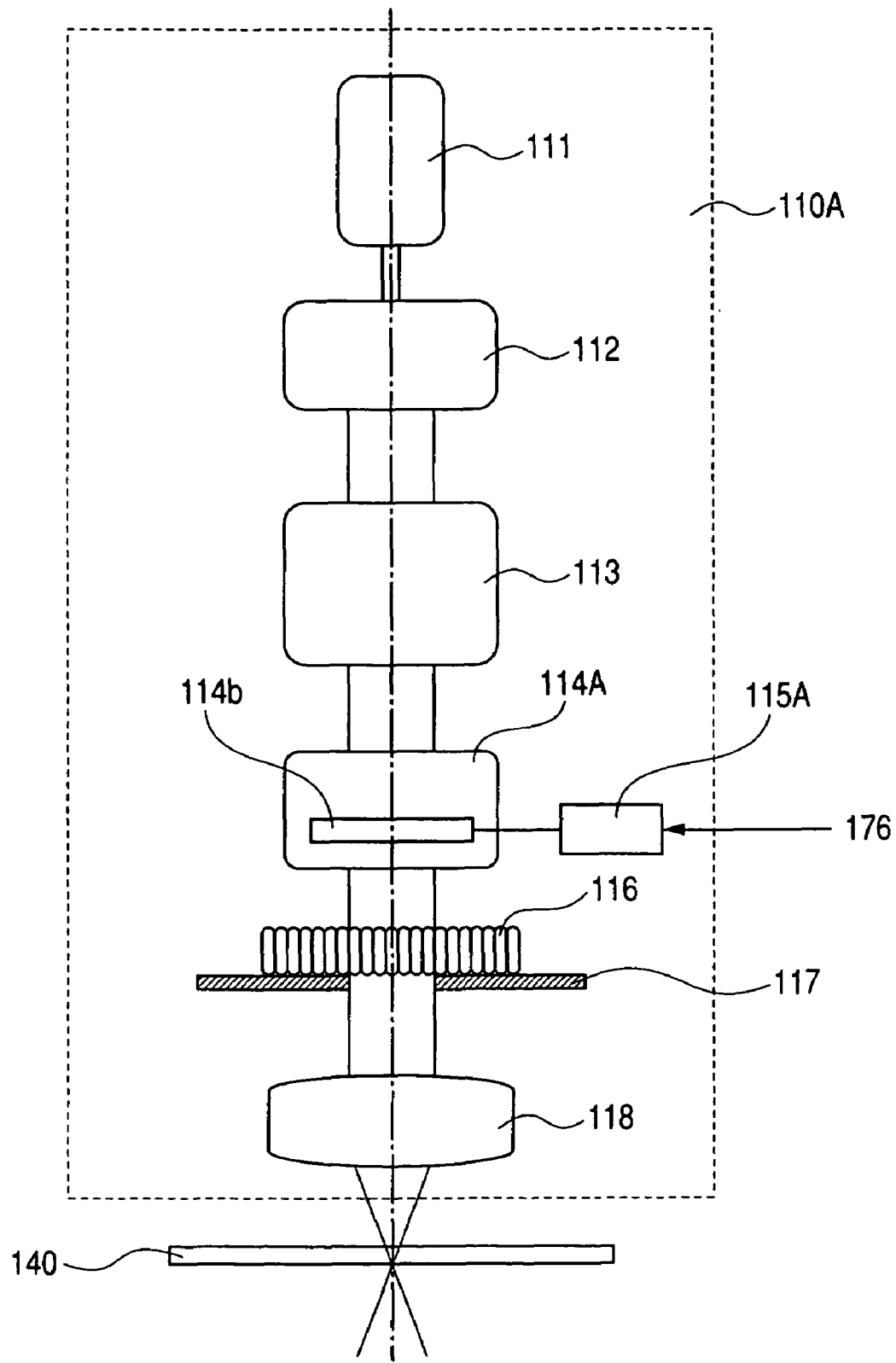
FIG. 9 is a block diagram schematically showing an illumination apparatus used in an exposure apparatus according to a second embodiment of the present invention.

As the NA adjusting means for adjusting the NA of the illumination light, a computer generated hologram (CGH) can be used instead of using the a stop 114a. FIG. 9 shows an illumination apparatus 100A as a modified example of the illumination apparatus 100 shown in FIG. 2. The illumination apparatus 110A uses, as the illumination adjusting portion 114A, a CGH 114b on which an illumination area pattern and an intensity distribution have been recorded so that the illumination light is condensed onto an intended illumination area. The illumination apparatus 100A has a driver portion 115A that drives the CGH 114b to the outside of the optical path at the time of exposure and into the optical path at the time of measurement.

The CGH 114b forms illumination states as shown in FIGS. 5A and 5B to conduct cohering. As a result, at the time of measurement, in the case where the measurement pattern is formed of the pin hole, the illumination light that satisfies σ≦0.3 in at least one direction can be formed. Also, in the case where the measurement pattern is formed of the slit, the illumination light of a that satisfies a σ≧1 or is as large as possible in the exposure illumination system can be readily formed in the lateral direction of the slit. The CGH 114b can form the illumination area having an arbitrary size or shape without losing the amount of light of the illumination light.

Third Embodiment

Figure 10:
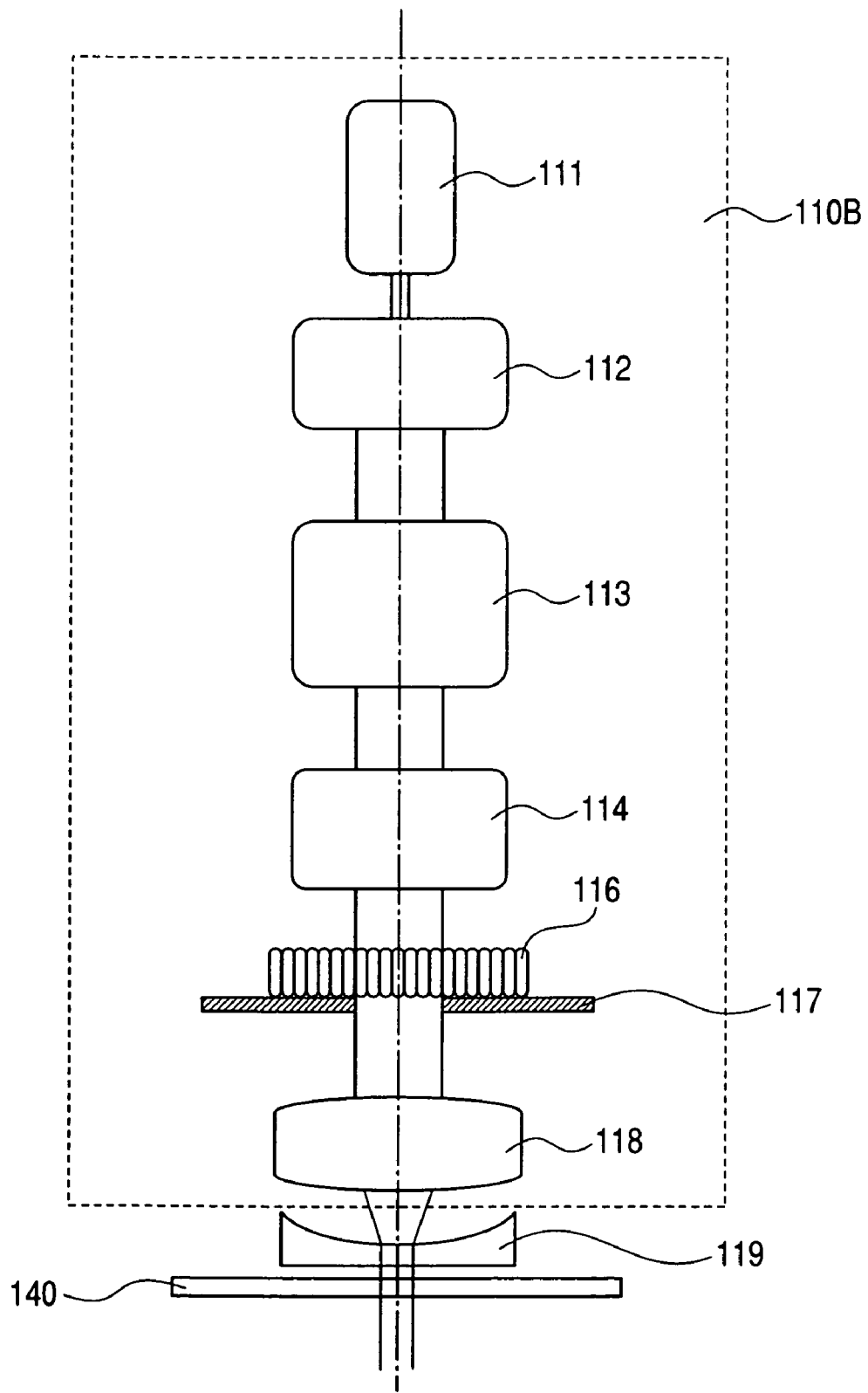
FIG. 10 is a block diagram schematically showing an illumination apparatus used in an exposure apparatus according to a third embodiment of the present invention.

As the NA adjusting means that adjusts the NA of the illumination light, a lens (for example, a cylindrical lens) 119 can be used instead of using the σ stop 114a. FIG. 10 shows an illumination apparatus 100B as a modified example of the illumination apparatus 100 shown in FIG. 2. In the illumination apparatus 100B, a lens 119 is disposed between the lens system 118 and the surface of the mask 140, and an incident angle with respect to the measurement pattern is adjusted. The lens 119 is driven to the outside of the optical path at the time of exposure and driven into the optical path at the time of measurement.

In the case where the measurement pattern is formed of the pin hole, the illumination light is formed so that σ becomes small at least in one direction by the cylindrical lens 119. Also, in the case where the measurement pattern is formed of the slit, the illumination light is formed so that σ is smaller (σ≦0.3) in the lateral direction of the slit, σ is larger (σ≧1) or as large as possible in the illumination optical system in the longitudinal direction of the slit. With the above constitution, the wavefront aberration of the pupil over the area as broad as possible in the projection optical system 150 can be calculated with a high precision.

Fourth Embodiment

Figure 11:
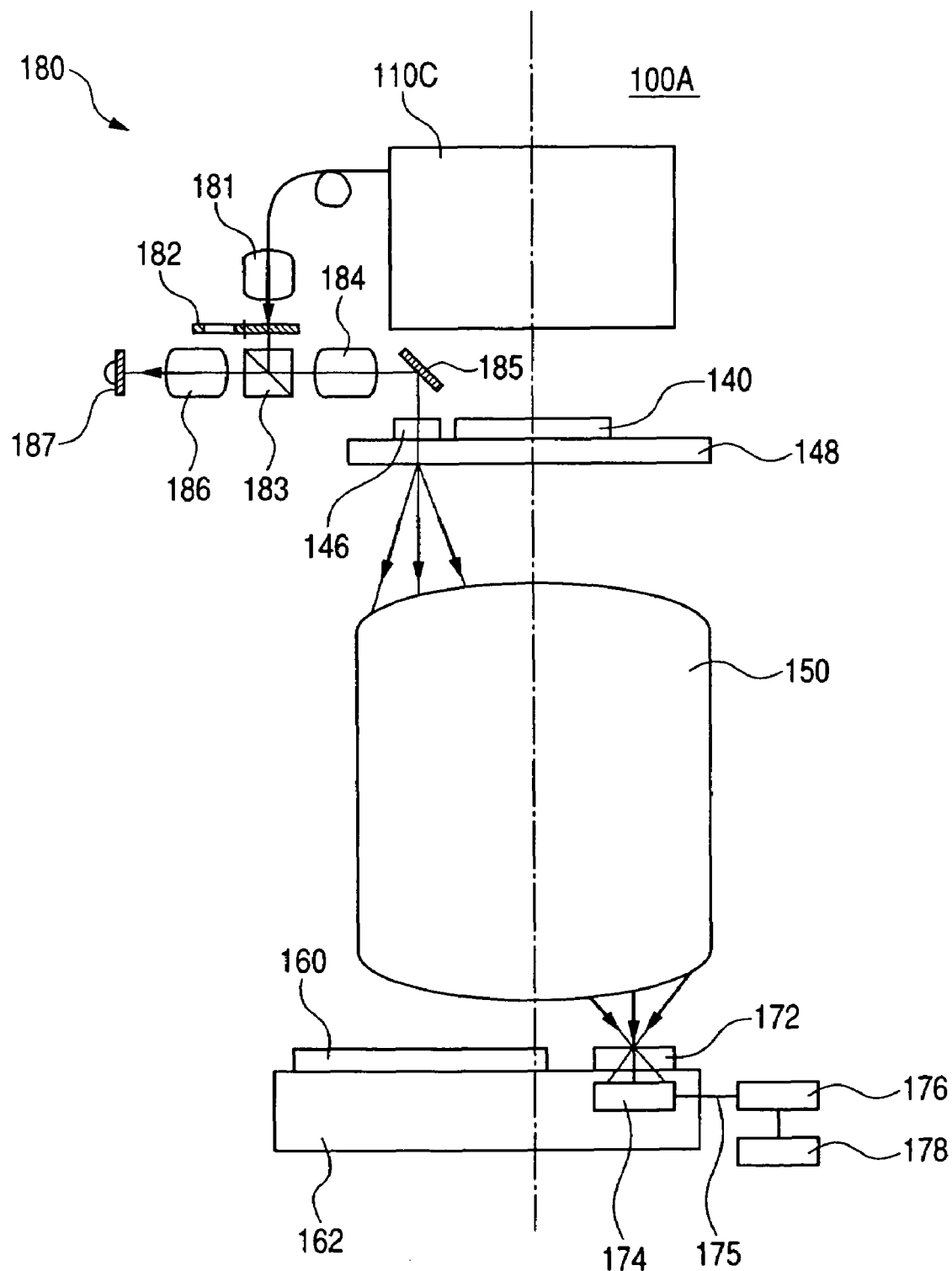
FIG. 11 is a block diagram schematically showing an exposure apparatus according to a fourth embodiment of the present invention.
Figure 12:
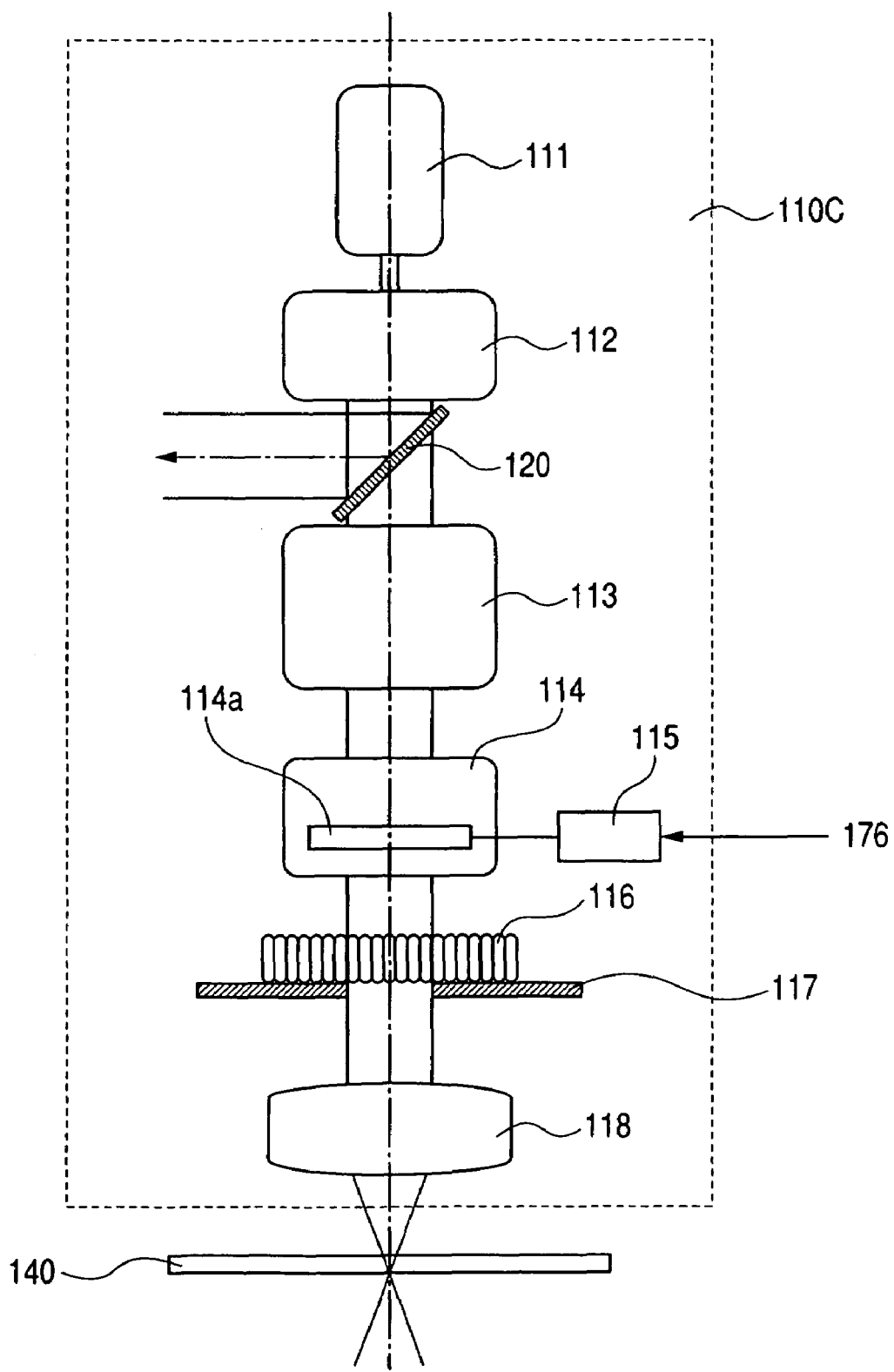
FIG. 12 is a block diagram schematically showing an illumination apparatus of the exposure apparatus shown in FIG. 11.

As a means for illuminating the measurement pattern, an alignment scope 180 that positions (aligns) the reticule 140 and the wafer 160 can be used instead of the illumination optical system. Hereinafter, this embodiment will be described with reference to FIGS. 11 and 12. FIG. 11 is a schematic block diagram showing an exposure apparatus 100A as a modified example of FIG. 1. FIG. 12 is a schematic block diagram showing an illumination apparatus 100C that generates a light introduced into the alignment scope 180. The illumination apparatus 110C is different from the illumination apparatus 110 in that a half mirror 120 is disposed between the light beam shaping portion 112 and the incoherent light forming portion 113.

The alignment scope 180 receives a light from the light source portion 111 through the half mirror 120. The alignment scope 180 includes a relay optical system 181, a stop 182, a beam splitter 183, an objective lens 184, a mirror 185, a relay optical system 186, and a sensor 187. The light that has been introduced into the alignment scope 180 illuminates an alignment mark on a reticule reference plate 146 through the relay optical system 181 and the objective lens 184. An image of the alignment mark on the reticule reference plate 146 is imaged on the sensor 187 by means of the objective lens 184 and the relay optical system 186. Thus, the alignment scope 180 can observe the alignment mark on the reticule reference plate 146. Also, the light that has been introduced into the alignment scope 180 illuminates the alignment mark on the wafer 160 through the relay optical system 181, the objective lens 184, and the projector lens 150. Then, the image of the alignment mark on the wafer 160 is imaged on the sensor 187 by means of the projector lens 150, the objective lens 184, and the relay optical system 186. Thus, the alignment scope 180 can observe the alignment mark on the wafer 160. An optical system may be further arranged between the relay optical system 186 and the sensor 187.

In the interferometer using the alignment scope 180, the light usually illuminates the alignment mark under the condition of $0.3 \leq \sigma \leq 1.0$ at the time of alignment measurement. In the alignment scope 180, a switching stop 182 is disposed between the relay optical system 181 and the beam splitter 183 such that the σ value can be switched over between the alignment time and the measurement time. The stop 182 is switched over so as to satisfy $\sigma \leq 0.3$ at the time of measurement to illuminate the pattern on the mask 140. The interference fringes are picked up by the image pickup means 174, and the control unit 176 calculates the wavefront aberration of the projection optical system 150.

In the case where the measurement pattern is formed of the slit, the switching stop 182 is configured so as to have small σ ($\sigma \leq 0.3$) in the lateral direction of the slit and to have large σ ($\sigma \geq 1$) or as large as possible in the alignment scope 180 in the longitudinal direction of the slit. With the above constitution, the wavefront aberration of the pupil over the area as broad as possible in the projection optical system 150 can be calculated with a high precision.

Fifth Embodiment

Figure 13:
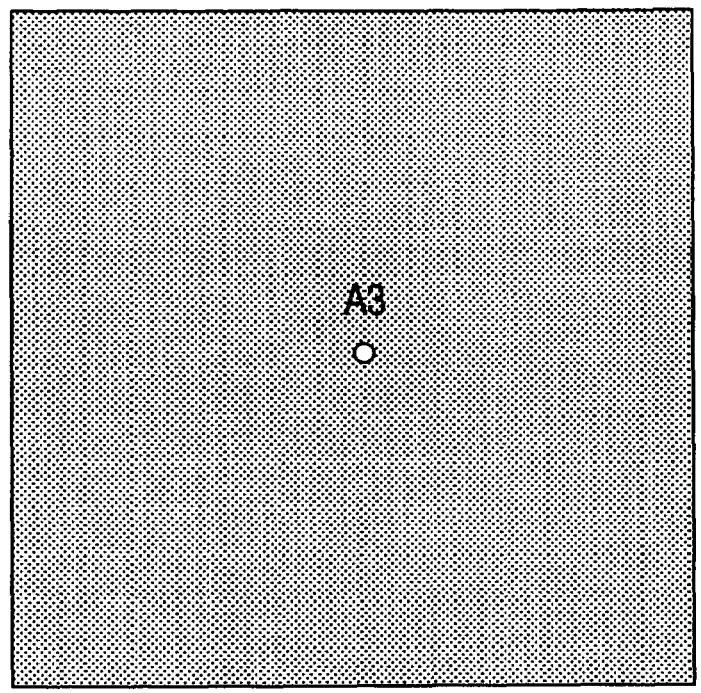
FIG. 13 is a plan view schematically showing a measurement pattern used in a measurement device of the exposure apparatus shown in FIG. 11.
Figure 14:
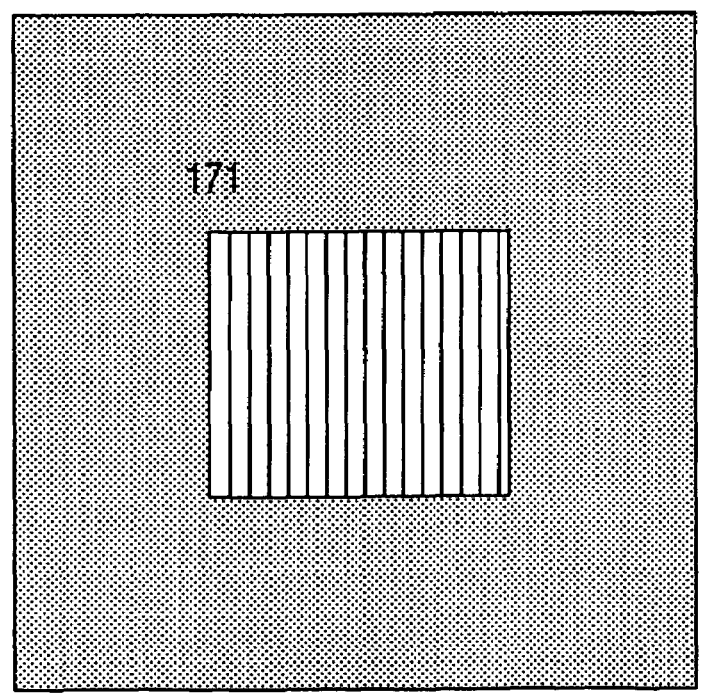
FIG. 14 is a plan view schematically showing another measurement pattern used in the measurement device of the exposure apparatus shown in FIG. 11.

In the following description, the measurement device 170 may be formed of a shearing interferometer. In this embodiment, the first measurement pattern shown in FIG. 3 in the first embodiment is replaced with a pattern A3 shown in FIG. 13, and the second measurement pattern shown in FIG. 4 is replaced with a diffraction grating 171 shown in FIG. 14. The pattern A3 is formed of an isolation pin hole in this embodiment, and a pin hole diameter ΦA3 is presented by the following formula. The pin hole diameter ΦA3 has a size of the diffraction limit or less.

$$\Phi A3 \leq 1.22 \cdot \lambda/(2 \cdot NA_{i1}) \quad (10)$$

The image that has passed through the pattern. A3 is imaged by the projection optical system 150 at a position defocused from the diffraction grating 171 on the stage reference plate 172. Then, two or more light beams different in the optical path length which have been diffracted by the diffraction grating 171 interfere with each other to form the interference fringes. The interference fringes are picked up by an image pickup means 174 that is disposed on a wafer stage 162. Then, the wavefront aberration of the projection optical system 150 is calculated based on the image data picked up by the image pickup means 174. The calculating method is identical with that in the first embodiment.

In this embodiment, σ of the illumination light that illuminates the pattern A3 is so adjusted as to satisfy $\sigma \leq 0.3$ by using the σ stop 114a as the NA adjusting means in such a manner that the illumination light becomes high in coherency in a shear direction of the light beam due to the diffraction grating 171, that is, in a direction along which the patterns of the diffraction grating 171 are aligned. As a result, the wavefront aberration of the projection optical system with a high precision can be calculated based on the interference fringes of the higher visibility.

Figure 15:
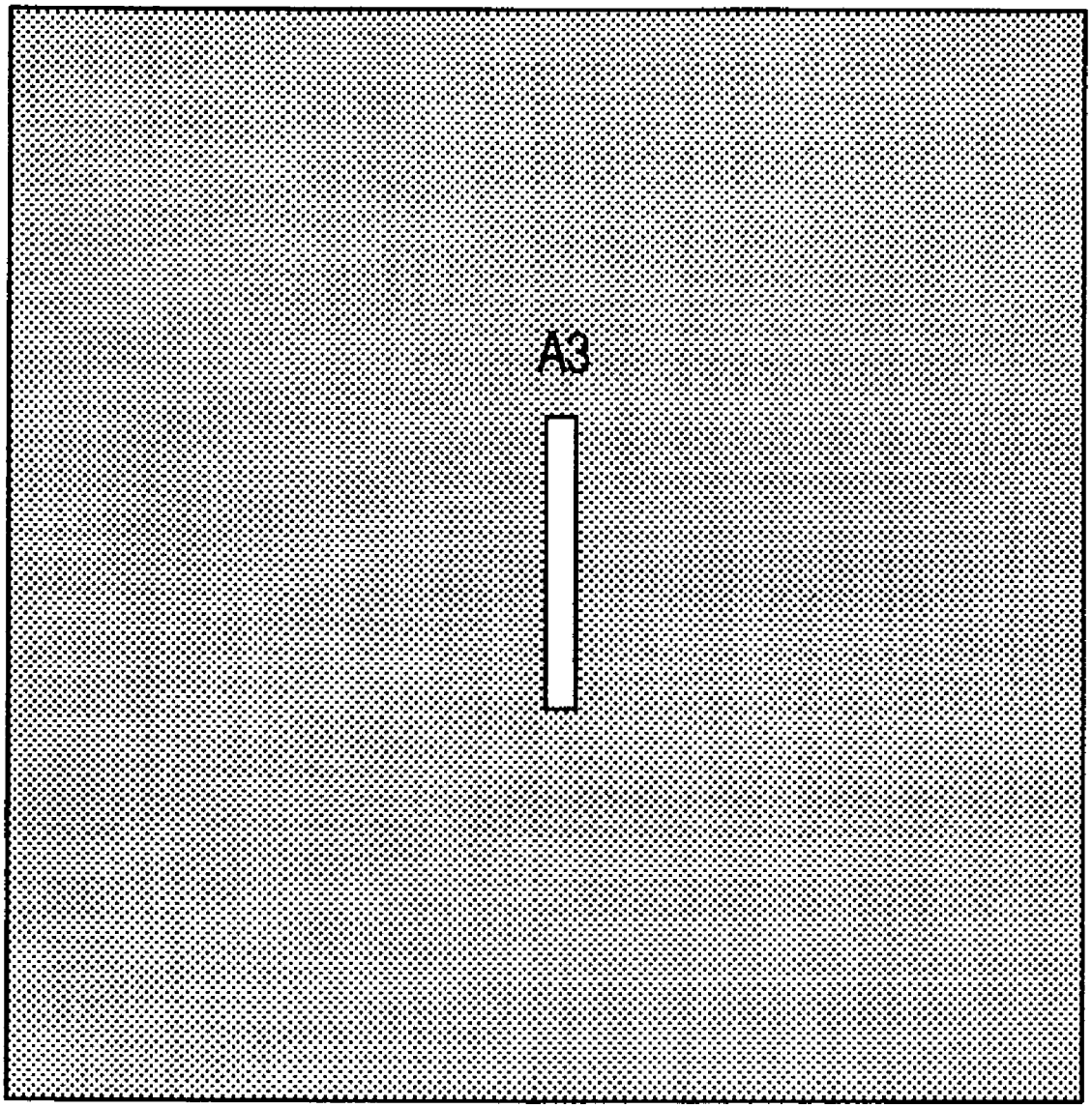
FIG. 15 is a plan view schematically showing a modified example of the measurement pattern shown in FIG. 13.

As the measurement pattern A3, the slit A3 shown in FIG. 15 may be used. A length ΔA3 in the lateral direction of the slit of A3 can be represented by the following formula, $$\Delta A3 \leq 1.22 \cdot \lambda/(2 \cdot NA_{i1}) \quad (11),$$

where ΔA3 is a width of the diffraction limit or less, and has an ideal spherical wave in the lateral direction of the slit A3. It is necessary that the length L in the longitudinal direction of the slit A3 is made smaller than the so-called isoplanatic area where the aberration of the projection optical system 150 regarded as substantially identical. Also, it is necessary that the shear direction of the diffraction grating and a measurement direction, that is, the lateral direction of the slit coincide with each other. Also, in the case where the pattern A3 is formed by the slit, the σ stop 114a is adjusted so that σ of the illumination-light is reduced in order to enhance a precision in the aberration measurement. In this case, the σ stop 114a of the illumination system is set to a configuration shown in FIG. 5B, as described with reference to FIGS. 7A and 7B. That is, σ is set to $\sigma \leq 0.3$ in the lateral direction of the rectangle in order to improve the visibility of the interference fringes, and σ is set to a $\sigma \geq 1$ or the maximum NA of the illumination optical system in the lateral direction of the rectangle in order to illuminate the pupil over the entire area or over the area as broad as possible in the projection optical system 150. With the above setting, the wavefront aberration of the pupil over a region as broad as possible of the projection optical system 150 is calculated with a high precision. The calculating method of the wavefront aberration of the projection optical system 150 is identical with that in the first embodiment.

Note that this embodiment may be applied to the CGH 114b described in the second embodiment, the lens 119 described in the third embodiment, or the alignment scope 180 described in the fourth embodiment.

Sixth Embodiment

Figure 16:
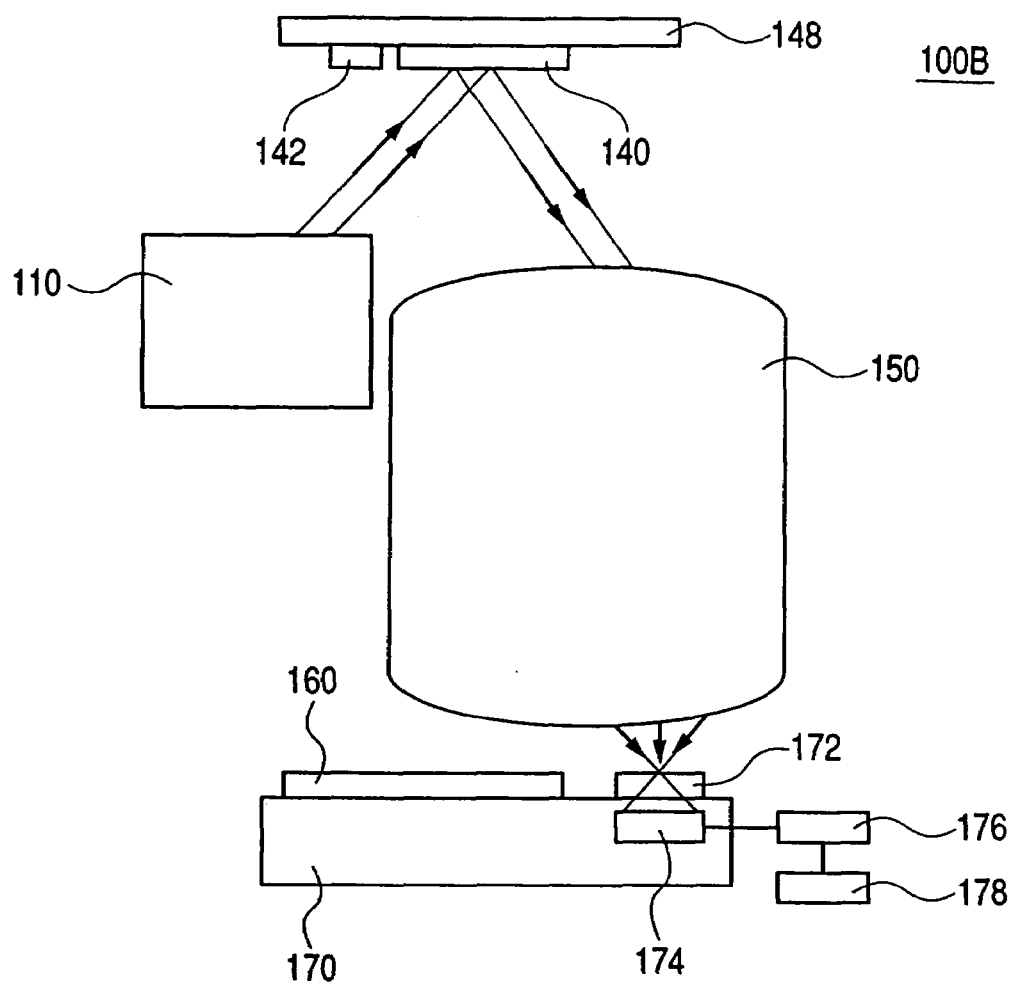
FIG. 16 is a schematic diagram showing an exposure apparatus equipped with a measurement device according to a sixth embodiment of the present invention.

The illumination light that is emitted from the illumination apparatus 110 may be an extreme ultraviolet (EUV) light that is 5 to 20 nm in wavelength. FIG. 16 is a schematic block diagram showing an exposure apparatus 100B that uses the EUV light. In FIG. 1, the illumination optical system, the masks 140 and 142, and the projection optical system 150 employ the lenses and/or the mirrors. However, in the exposure apparatus 100B, the optical system is configured only by mirrors, and the masks 140 and 142 also use reflective masks. Other structures are identical with those in the above embodiments.

Seventh Embodiment

Hereinafter, a description will be given of an aberration correcting method according to a seventh embodiment of the present invention. A projection optical system 150 of the exposure apparatus 100 has plural optical elements (not shown) movable along an optical axis direction and/or a direction orthogonal to the optical axis. Then, the exposure apparatus 100 drives one or more optical elements by means of a driver system for aberration adjustment (not shown) on the basis of the aberration information obtained as to the projection optical system 150. As a result, the aberration (in particular, Seidel's five aberrations) of the projection optical system 150 can be corrected or optimized. Also, as other methods of adjusting the aberration of the projection optical system 150, there are a method of driving the mirror in the case where the projection optical system 150 has a mirror, and a method of deforming the mirror by means of an actuator. In addition, as other methods of adjusting the aberration of the projection optical system 150, there are a method in which a parallel plate is arranged in the projection optical system 150 to tilt the parallel plate, and a method of changing a pressure of a gas that exists between the optical elements constituting the projection optical system 150.

Eighth Embodiment

Figure 18:
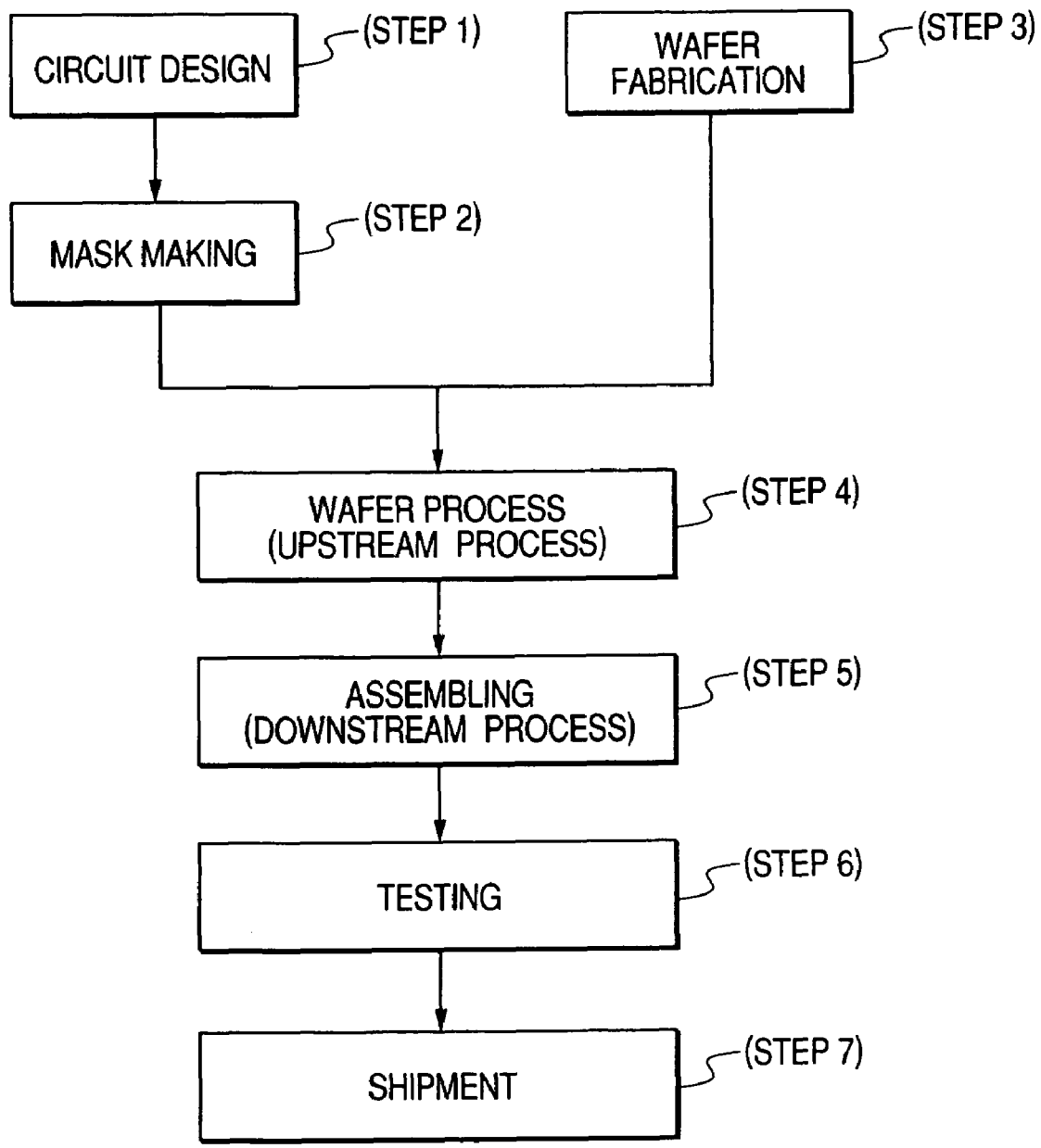
FIG. 18 is a flowchart for explaining the manufacture of a device (a semiconductor chip such as an IC or an LSI, an LCD, or a CCD)

Subsequently, a device manufacturing method using the exposure apparatus 100 will be described. FIG. 18 is a flowchart for explaining the manufacturing of a semiconductor device (a semiconductor device such as an IC or an LSI, a liquid crystal panel, or a CCD). In step 1 (circuit design), a circuit is designed for the semiconductor device. In step 2 (mask making), a mask on which a designed circuit pattern is formed is fabricated. On the other hand, in step 3 (wafer fabrication), a wafer is fabricated by using a material such as silicon. A step 4 (wafer process) is called "upstream process", and in the step 4, an actual circuit is formed on the wafer through the lithography technique by using the mask and the wafer prepared as described above. Succeeding step 5 (assembling) is called "downstream process", and in the step 5, the semiconductor is chipped by using the wafer fabricated in step 4. This step includes processes such as an assembling process (dicing, bonding) and a packaging process (chip packaging). In step 6 (testing), the operation confirmatory test, the durability test, and the like are conducted on the semiconductor device fabricated in step 5. The semiconductor device is completed through the above processes, and then shipped (step 7).

Figure 19:
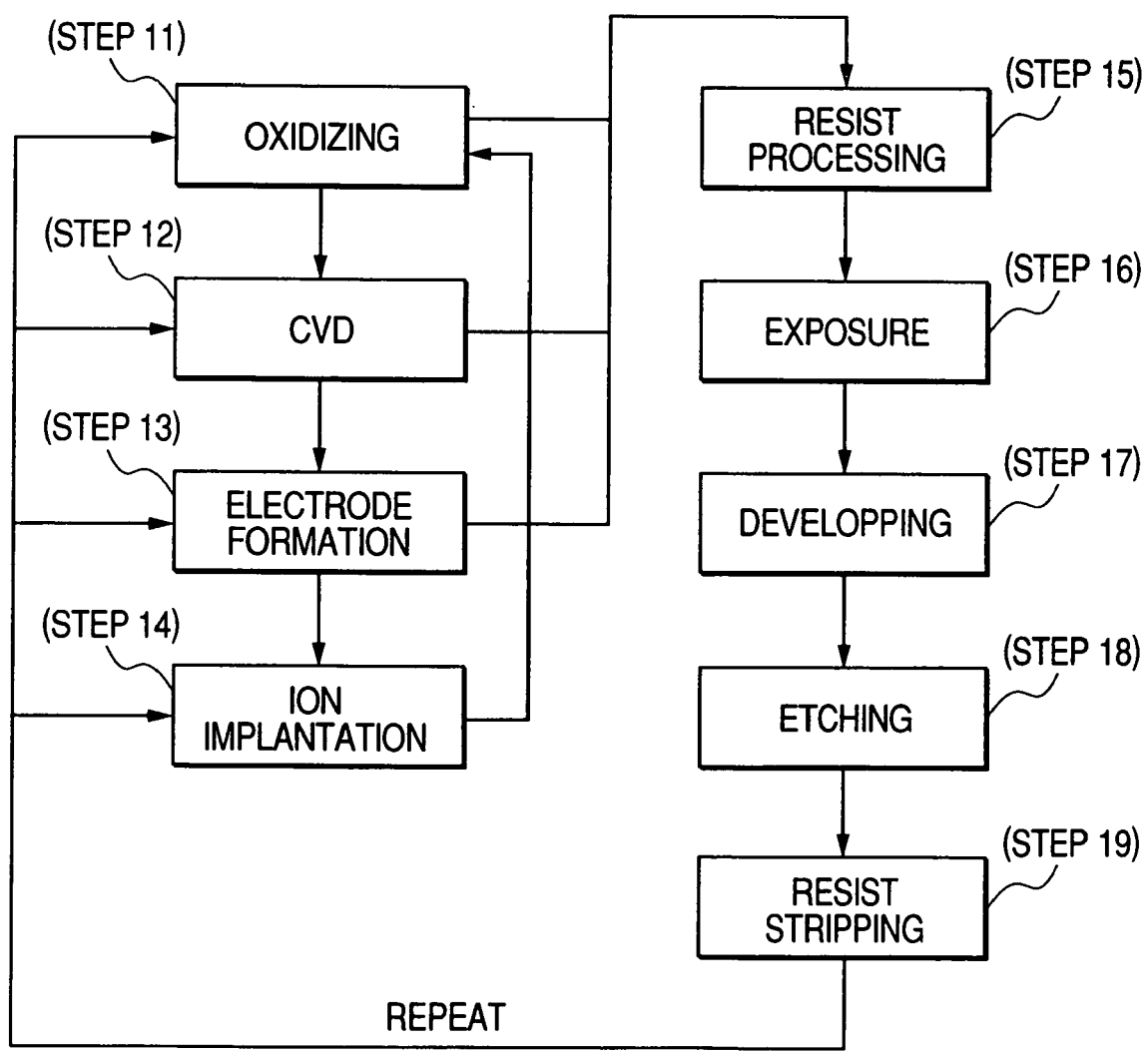
FIG. 19 is a detailed flowchart showing a wafer process of a step 4 shown in FIG. 18.

FIG. 19 is, a flowchart showing in detail the wafer process in step 4 of FIG. 18. In step 11 (oxidizing), the surface of the wafer is oxidized. In step 12 (CVD), an insulating film is formed on the surface of the wafer. In step 13 (electrode formation), an electrode is formed on the wafer by vapor deposition or the like. In step 14 (ion implantation), ions are implanted in the wafer. In step 15 (resist processing), the wafer is coated with a photosensitive material. In step 16 (exposure), the circuit pattern of the mask 140 is exposed to the wafer 160 by the exposure apparatus 100. In step 17 (developing), the exposed wafer 47 is developed. In step 18 (etching), a portion other than the developed resist image is etched. In step 19 (resist striping), the unnecessary resist after the etching is removed. Those steps are repeatedly conducted to form a circuit pattern on the wafer 160 in multiplication. With the manufacturing method of this embodiment, the imaging performance of the projection optical system 150 can be rapidly and readily acquired, and therefore, the throughput of exposure is not lowered. Accordingly, it is possible to use the projection optical system 150 in which the wavefront aberration is corrected with a high precision. For that reason, the device (a semiconductor device, an LCD element, an image pickup device (CCD), or a thin film magnetic head) of the high resolution, which has been difficult to be manufactured conventionally, can be manufactured cost-efficiently with improved productivity. Also, the device manufacturing method using the above exposure apparatus 100 and a device as the resultant products (intermediate or final products) constitute other aspects of the present invention.

The entire-disclosure of Japanese Patent Application. No. 2004-296973 filed on Oct. 8, 2004 including claims, specification, drawings, and abstract are incorporated herein by reference in its entirety.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus, comprising:
    a projection optical system for projecting an exposure pattern onto an object to be exposed;
    a measurement device for measuring an optical performance of the projection optical system by guiding light to the projection optical system through a measurement pattern to detect interference fringes formed by the light emitted from the projection optical system; and
    adjustment means for adjusting a numerical aperture of the light that illuminates the measurement pattern,
    wherein the adjustment means adjusts the numerical aperture so that the visibility of the interference fringes V, which is defined as $V=(I_{max}-I_{min})/(I_{max}+I_{min})$, is equal to or more than 0.3, where $I_{max}$ represents the maximum amount of light of the interference fringes, and $I_{min}$ represents the minimum amount of light of the interference fringes, when the measurement device measures an optical performance of the projection optical system.

2. An exposure apparatus according to claim 1, wherein:
    the measurement device includes a diffraction grating;
    the measurement device comprises a shearing interferometer for imaging the measurement pattern in the vicinity of the diffraction grating through the projection optical system; and
    the interference fringes are formed by two or more lights that are different in order and emitted from the diffraction grating.

3. An exposure apparatus according to claim 1, wherein the adjusting means includes the aperture stop.

4. An exposure apparatus according to claim 1, wherein the adjusting means has a computer generated hologram that is disposed to be retractable from the optical path.

5. An exposure apparatus according to claim 1, wherein the adjusting means has a lens that is disposed so as to be retractable from the optical path.

6. An exposure apparatus according to claim 5, wherein the lens is a cylindrical lens.

7. An exposure apparatus according to claim 1, further comprising an illumination optical system that illuminates the exposure pattern and the measurement pattern.

8. An exposure apparatus according to claim 1, further comprising an alignment scope that illuminates the measurement pattern, and an alignment mark used for alignment of a mask on which the exposure pattern is formed and the object to be exposed.

9. A device manufacturing method, comprising the steps of:
exposing an object to be exposed by using the exposure apparatus according to claim 1; and
developing the object to be exposed which is exposed.

10. An exposure apparatus, comprising:
a projection optical system for projecting an exposure pattern onto an object to be exposed;
a measurement device for measuring an optical performance of the projection optical system by guiding light to the projection optical system through a measurement pattern to detect interference fringes formed by the light emitted from the projection optical system; and
adjustment means for adjusting a numerical aperture of the light that illuminates the measurement pattern,
wherein the adjustment means adjusts the numerical aperture to satisfy $\sigma \leqq 0.3$, where $\sigma$ represents $NA_{i1}/NA_o$, $NA_{i1}$ represents the numerical aperture, and $NA_o$ represents the numerical aperture of the projection optical system at the measurement pattern side, when the measurement device measures an optical performance of the projection optical system.

11. A device manufacturing method, comprising the steps of:
exposing an object to be exposed by using the exposure apparatus according to claim 10; and
developing the object to be exposed which is exposed.

12. An exposure apparatus, comprising:
a projection optical system for projecting an exposure pattern onto an object to be exposed;
a measurement device for measuring an optical performance of the projection optical system by guiding light to the projection optical system through a measurement pattern to detect interference fringes formed by the light emitted from the projection optical system; and
adjustment means for adjusting a numerical aperture of the light that illuminates the measurement pattern,
wherein the adjustment means adjusts the numerical aperture so as the numerical aperture of the light on the measurement pattern in a lateral direction to be different from the numerical aperture of the light on the measurement pattern in a longitudinal direction, when the measurement device measures an optical performance of the projection optical system.

13. An exposure apparatus according to claim 12, wherein the adjustment means adjusts the numerical aperture to satisfy $\sigma_1 \leqq 0.3$, where $\sigma_1$ is defined as $NA_1/NA_O$, $NA_1$ represents the numerical aperture of the light that illuminates the measurement pattern in the lateral direction, and $NA_O$ represents the numerical aperture of the projection optical system at the measurement pattern side.

14. An exposure apparatus according to claim 12, wherein the adjustment means adjusts the numerical aperture to satisfy $\sigma_2 \geqq 1$, where $\sigma_2$ is defined as $NA_2/NA_O$, $NA_O$ represents the numerical aperture of the projection optical system at the measurement pattern side, and $NA_2$ represents the numerical aperture of the light that illuminates the measurement pattern in the longitudinal direction.

15. An exposure apparatus according to claim 12, wherein:
the measurement device includes a diffraction grating;
the measurement device comprises a shearing interferometer for imaging the measurement pattern in the vicinity of the diffraction grating through the projection optical system;
the interference fringes are formed by two or more lights that are different in order and emitted from the diffraction grating; and
the lateral direction of the measurement pattern is in a direction along which the grating patterns of the diffraction grating are aligned.

16. An exposure apparatus according to claim 12, wherein the adjusting means further includes the aperture stop having a substantially slit-shaped aperture.

17. A device manufacturing method, comprising the steps of:
exposing an object to be exposed by using the exposure apparatus according to claim 12; and
developing the object to be exposed which is exposed.

18. An exposure apparatus, comprising:
a projection optical system for projecting an exposure pattern onto an object to be exposed;
a measurement device for measuring an optical performance of the projection optical system by guiding light to the projection optical system through a measurement pattern to detect interference fringes formed by the light emitted from the projection optical system;
an illumination optical system that illuminates the exposure pattern and the measurement pattern; and
adjustment means for adjusting a numerical aperture of the light that illuminates the measurement pattern,
wherein the adjustment means adjusts the numerical aperture to satisfy $\sigma_1 \leqq 0.3$ and $\sigma_2 \geqq 1$, where $\sigma_1$ represents $NA_1/NA_o$, $\sigma_2$ represents $NA_2/NA_o$, $NA_1$ represents the numerical aperture of the light that illuminates the measurement pattern in a lateral direction, $NA_2$ represents the numerical aperture of the light that illuminates the measurement pattern in a longitudinal direction, and $NA_p$ represents the numerical aperture of the projection optical system at the measurement pattern side, when the measurement device measures an optical performance of the projection optical system, and
wherein the adjusting means has a computer generated hologram that is disposed to be retractable from the optical path of the illumination optical system.

19. A device manufacturing method, comprising the steps of:
exposing an object to be exposed by using the exposure apparatus according to claim 18; and
developing the object to be exposed which is exposed.

* * * * *